(12) United States Patent
Tanigami et al.

(10) Patent No.: US 6,395,619 B2
(45) Date of Patent: May 28, 2002

(54) PROCESS FOR FABRICATING A SEMICONDUCTOR DEVICE

(75) Inventors: Takuji Tanigami; Kenji Hakozaki, both of Fukuyama; Naoyuki Shinmura, Tenri; Shinichi Sato; Masanori Yoshimi, both of Fukuyama; Takayuki Taniguchi, Tenri, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/203,330

(22) Filed: Dec. 2, 1998

(30) Foreign Application Priority Data

Dec. 5, 1997 (JP) .............................................. 9-335396

(51) Int. Cl.[7] .............................................. H01L 21/76
(52) U.S. Cl. ...................... 438/424; 438/427
(58) Field of Search ................................. 438/424, 427, 438/425, 426, 428, 435, 430, 437

(56) References Cited

U.S. PATENT DOCUMENTS

| | | | | |
|---|---|---|---|---|
| 4,954,459 A | * | 9/1990 | Avanzino et al. | 438/437 |
| 5,498,565 A | * | 3/1996 | Gocho et al. | 438/424 |
| 5,578,519 A | * | 11/1996 | Cho | 437/67 |
| 5,889,335 A | * | 3/1999 | Kuroi | 257/797 |
| 5,943,590 A | * | 8/1999 | Wang et al. | 438/424 |
| 5,960,300 A | * | 9/1999 | Yabu et al. | 438/436 |
| 5,998,279 A | * | 12/1999 | Liaw | 438/424 |
| 6,043,133 A | * | 3/2000 | Jang et al. | 438/401 |

FOREIGN PATENT DOCUMENTS

| | | | |
|---|---|---|---|
| JP | 1-220831 | * | 9/1989 |
| JP | Hei 8(1996)-46032 | | 2/1996 |

* cited by examiner

Primary Examiner—Michael Trinh
(74) Attorney, Agent, or Firm—Nixon & Vanderhye P.C.

(57) ABSTRACT

The present invention provides a process for fabricating semiconductor device comprising the steps of: forming an etching-stop layer on a semiconductor substrate; patterning the etching-stop layer so that the etching-stop layer remains in a region to be an active region and is removed from a region to be a device isolation region, followed by forming a trench in the region to be the device isolation region; depositing on the semiconductor substrate an insulating film having a thickness greater than or equal to the depth of the trench; forming a resist pattern having an opening above the etching-stop layer above the active region adjacent to a device isolation region whose width is greater than or equal to a predetermined value, followed by etching the insulating film using the resist pattern as a mask; and polishing the insulating film existing on the resulting semiconductor substrate for flattening after removing the resist pattern.

12 Claims, 7 Drawing Sheets

FIG.1(a') 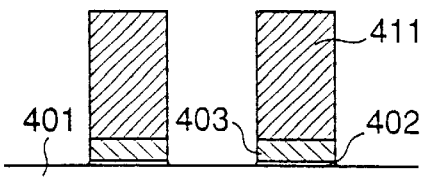

FIG.1(b') 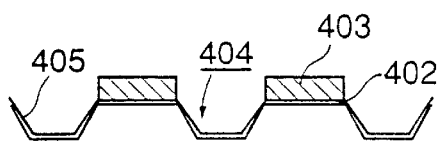

FIG.1(c') 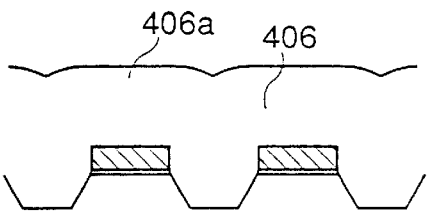

FIG.1(d') 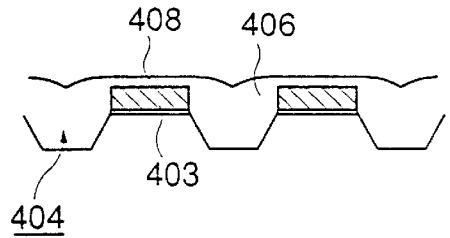

PROCESS FOR FABRICATING A SEMICONDUCTOR DEVICE

CROSS-REFERENCE TO RELATED APPLICATION

This application is related to Japanese application No. HEI9(1997)-335396, filed on Dec. 5, 1997 whose priority is claimed under 35 USC § 119, the disclosure of which is incorporated by reference in its entirety.

BACKGROUND OF THE INVENTION

1. Field of the Invention

The present invention relates to a process for fabricating a semiconductor device, more particularly, to a process for fabricating a semiconductor device which enables a device isolation region of the semiconductor device to be formed flat so as to have a uniform thickness.

2. Description of Related Art

A conventional process of forming a device isolation region in a semiconductor device is described below.

First, referring to FIG. 5(a), a pad oxide film 702 and an etching-stop layer 703 are formed in sequence on a P-type semiconductor substrate 701. Then, using a resist 708 as a mask, the etching-stop layer 703 and the pad oxide film 702 are removed by etching from a region to be a device isolation region.

Subsequently, as shown in FIG. 5(b), using the resist 708 as a mask, the semiconductor substrate 701 is further etched to form a trench 704. After the resist 708 is removed, a second thin oxide film 705 is formed in the trench 704 by thermal oxidation.

Further, as shown in FIG. 5(c), an insulating film 706, which is to be a buried insulating film, is formed on the resulting semiconductor substrate 701. Here, the surface 706a of the insulating film 706 on and around the etching-stop layer 703 is higher than the surface of the insulating film 706 in other regions.

Then, as shown in FIG. 5(d), the surface of the insulating film 706 is polished by a CMP method until the surface 703a of the etching-stop layer is exposed. Thereby, a device isolation region can be formed of the buried insulating film 707 whose surface is flat.

However, degree of flatness of the buried insulating film obtained by the above-described method depends greatly on a pattern in which device isolation regions, active regions and the like are configured.

More particularly, where the trench has a large width (i.e., the device isolation region is wide), the insulating film 704, especially in a central portion M of the trench 704, is polished into a thin film, as shown in FIG. 6. That is, there arises a problem of a so-called dishing phenomenon. As a result, the insulating film 706 becomes thinner where the device isolation region has a large width, while the insulating film 706 is thicker where the device isolation region has a small width. That leads to unevenness of the surface of the insulating film 706 and makes it difficult to perform a pattern for interconnections or the like to be formed thereon later. Besides, the thinned insulating film 706 brings about the problem that capacity increases between the substrate and interconnections, which results in a delay in operation of circuitry.

Also as illustrated in FIG. 6, when the insulating film 706 is polished so that an area where active regions are densely formed is flattened, the etching-stop layer 703 is completely polished away and the surface of the semiconductor substrate 701 is also polished where active regions are isolated and narrow. As a result, there arises a problem in that electric properties of devices formed thereon deteriorate.

Furthermore, as shown in FIG. 7, in the case where an active region of different width co-exists, the insulating film 706 is not completely polished away by the CMP method in an area including a wide active region, while in an area including a narrow active region, not only the insulating film 706 but the etching-stop layer 703 is completely removed even in the middle of the polishing process.

To cope with this problem, Japanese Unexamined Patent Publication No. HEI 8(1996)-46032 proposes a method for flattening the surface of device isolation regions by relatively simple steps.

According to this method, as shown in FIG. 8(a), a pad oxide film 102 and an etching-stop layer 103 of polysilicon are deposited on a P-type semiconductor substrate 101, first. Then, the etching-stop layer 103, the pad oxide film 102 and the semiconductor substrate 101 in a device isolation region-to-be are sequentially etched using a resist (not shown) as a mask to form a trench 104 in the semiconductor substrate 101. Thus a mesa portion is formed on the semiconductor substrate 101. Then, the resist is removed.

Subsequently, as shown in FIG. 8(b), a second thin oxide film 105 is formed on the entire surface of the resulting semiconductor substrate 101 by thermal oxidation. A buried insulating film 106 is formed by a bias ECR (electron-cyclotron resonance) method, and an etching-stop layer 107 of polysilicon is further deposited.

Then, as shown in FIG. 8(c), a convex portion of the etching-stop layer 107 is flattened by a silicon polishing technique to expose the surface of a convex portion of the buried insulating film 106.

As shown in FIG. 8(d), the buried insulating film 106 is etched by an RIE (reactive ion etching) method using the etching-stop layer 107 as a mask to expose the etching-stop layer 103.

Further, as shown in FIG. 8(e), an exposed portion of the etching-stop layer 103 as well as the etching-stop layer 107 are removed.

By the above-described steps, a protruding portion 109 of the buried insulating film 106 and a remaining portion 110 of the etching-stop layer 103 are formed on the mesa portion of the semiconductor substrate 101.

Then, as shown in FIG. 8(f), the surface of the resulting semiconductor substrate 101 is polished to be flattened. It is noted that, in the polishing process, a portion having a small area can be readily polished because the small-area portion receives a higher polishing pressure. Therefore, the protruding portion 109 of the buried insulating film 106 and the remaining portion 110 of the etching-stop layer 103 can be easily removed regardless of irregularities on the surface of the semiconductor substrate 101.

In this method, however, when the convex portion of the etching-stop layer 107 is flattened to expose the convex portion of the buried insulating film 106 as shown in FIG. 8(c), the dishing phenomenon takes place and the buried insulating film 106 in the trench 104 is exposed if the trench 104 has a large width (the device isolation region is wide) as shown in FIG. 9(a).

As a result, as shown in FIG. 9(b), the exposed portion of the buried insulating film 106 is etched at the later etching step by the RIE method. As a result, this portion of the buried insulating film 106 is removed in the form of a trench, and step difference is produced in the buried insulating film 106, which further makes difficult the patterning in a later step.

SUMMARY OF THE INVENTION

The present invention provides a process for fabricating a semiconductor device comprising the steps of: forming an etching-stop layer on a semiconductor substrate; patterning the etching-stop layer so that the etching-stop layer remains in a region to be an active region and is removed from a region to be a device isolation region, followed by forming a trench in the region to be the device isolation region; depositing on the semiconductor substrate an insulating film having a thickness greater than or equal to the depth of the trench; forming a resist pattern having an opening above the etching-stop layer above the active region adjacent to a device isolation region whose width is greater than or equal to a predetermined value, followed by etching the insulating film using the resist pattern as a mask; and polishing the insulating film existing on the resulting semiconductor substrate for flattening after removing the resist pattern.

In another aspect, the present invention provides a process for fabricating a semiconductor device comprising the steps of: forming an etching-stop layer on a wafer providing a plurality of semiconductor substrates; patterning the etching-stop layer using a resist as a mask so that the etching-stop layer remains in a region to be an active region and in a peripheral region of the wafer and is removed from a region to be a device isolation region, followed by forming a trench in the region to be the device isolation region; depositing on the wafer an insulating film having a thickness greater than or equal to the depth of the trench; forming a resist pattern having an opening above the etching-stop layer in the active region adjacent to a device isolation region whose width is greater than or equal to a predetermined value and in the peripheral region of the wafer, followed by etching the insulating film using the resist pattern as a mask; and polishing the insulating film existing on the resulting wafer for flattening after removing the resist pattern.

In other words, in view of the above-described problems, an object of the present invention is to provide a process for fabricating a semiconductor device which enables reproducible formation of a device isolation region from a buried insulating film having a flatter surface regardless of the width of the device isolation region and an active region.

DESCRIPTION OF THE PREFERRED EMBODIMENTS

Figure 1A:
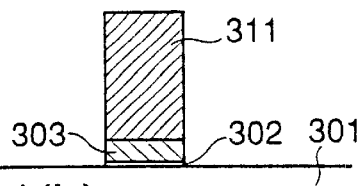
FIGS. 1(*a*) to 1(*d*) and 1(*a*') to 1(*d*') are schematic sectional views of a major part illustrating an embodiment of the process for fabricating a semiconductor device of the present invention.
Figure 1B:
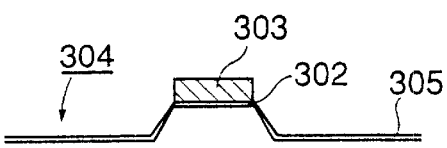
Figure 1C:
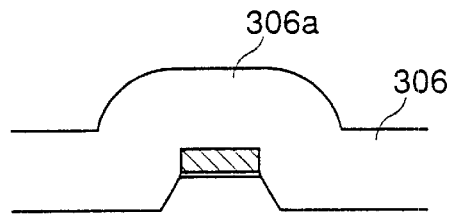
Figure 1D:
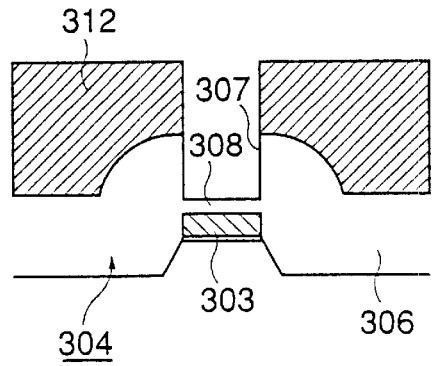
Figure 2E:
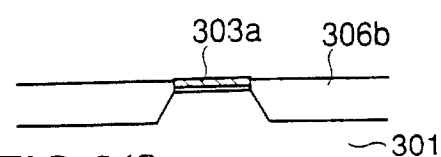
FIGS. 2(*e*) to (*h*) and 2(*e*') to 2(*h*') are schematic sectional views of a major part illustrating an embodiment of the process for fabricating a semiconductor device of the present invention.
Figure 2E:
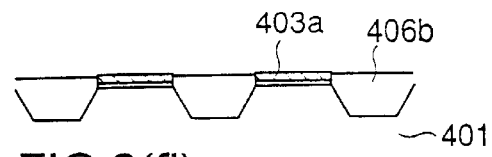
Figure 2F:
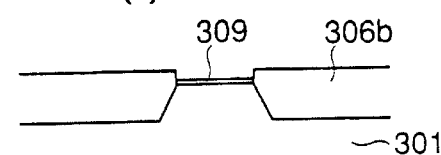
Figure 2F:
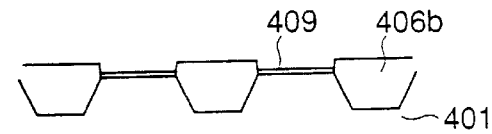
Figure 2G:
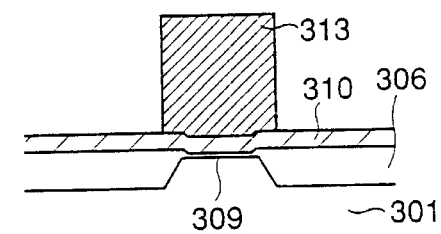
Figure 2G:
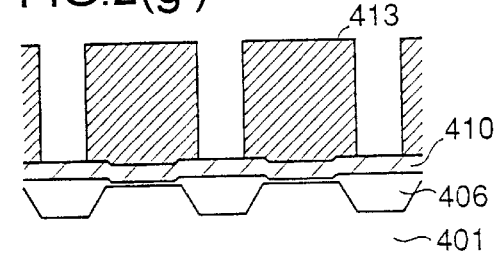
Figure 2H:
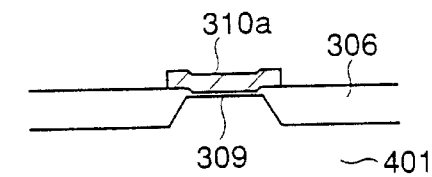
Figure 2H:
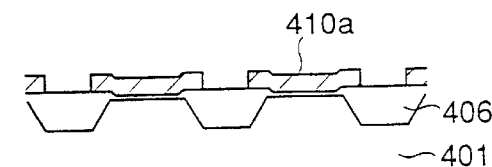

The semiconductor substrate in the process for fabricating a semiconductor device of the present invention may be any semiconductor substrate which is usually used for producing a semiconductor device. Materials for the semiconductor substrate are not particularly limited, including semiconductors such as silicon and gallium, and compound semiconductors such as GaAs and InGaAs, for example. Among such materials, silicon is preferred. Here, the semiconductor substrate may be in the form of a wafer providing a plurality of semiconductor substrates.

First, an etching-stop layer is formed on the semiconductor substrate. The etching-stop layer functions as a stopper at the etching of a buried insulating film, described later, which is used for forming a device isolation region. Preferably, the etching-stop layer has a relatively large selective etching ratio to the buried insulating film. The etching-stop layer may usually be formed of a silicon nitride film. The thickness thereof can be selected as necessary depending upon the selective etching ratio, etching method, etching rate and the like, but may be about 50 nm to 200 nm, for example. In the case where the etching-stop layer is formed of silicon nitride, for example, the etching-stop layer may be formed by a CVD method using silane gas and nitrogen gas or by a like method. In the case where the etching-stop layer is formed on the semiconductor substrate, a protective film may be formed beforehand for protecting the surface of the semiconductor substrate. The protective film may be formed of silicon oxide to a thickness of about 5 nm to 50 nm.

In the case where the substrate is used in the form of a wafer, the etching-stop layer may preferably be formed also in a peripheral region of the wafer which region is not used as a semiconductor substrate.

Next, the etching-stop layer is patterned. For patterning the etching-stop layer, for example, a resist pattern is formed to have an opening in a device isolation region-to-be and cover an active region-to-be by use of photoresist and then the etching-stop layer is etched using the resist pattern as a mask.

In the case where the semiconductor substrate is used in the form of a wafer, it is preferable to cover the peripheral region of the wafer with the resist pattern for preventing the etching-stop layer from being removed from the peripheral region.

Subsequently, (a) trench(s) is/are formed in the device isolation region-to-be on the semiconductor substrate. This trench is to function as a device isolation region with the insulating film buried therein. As a mask for forming the trench, the resist pattern used for pattering the above-described etching-stop layer may preferably be continuously used. The depth of the trench may be selected as required depending on the function of a finished semiconductor device, voltage when the device is used, the size of the device and the like, but may be about 200 nm to 500 nm, for example.

Next, an insulating film is formed on the semiconductor substrate. This insulating film functions as the buried insulating film for forming the device isolation region. As materials for the insulating film, a variety of substances can be used such as silicon oxide and silicon nitride. Because this insulating film is required to fill the trench completely, the thickness of the insulating film must be greater than or equal to the depth of the trench and is preferably greater than the sum of the depth of the trench and the thickness of the etching-stop layer. For example, where the trench is about 300 nm deep and the etching-stop layer is about 50 nm thick, the insulating film may be about 400 nm to 600 nm thick, preferably about 500 nm thick.

Next, a resist pattern having a desired configuration is formed on the insulating film. Here, in the case where a wide device isolation region, a narrow device isolation, a wide active region and a narrow active region all or partly co-exist, the resist pattern has an opening in an active region adjacent to a device isolation region whose width is greater than or equal to a predetermined value, regardless of the width of the active region. In other words, the resist pattern is configured to cover over the device isolation region having a width greater than or equal to the predetermined value. If there is a device isolation region whose width is smaller than the predetermined value, the resist pattern preferably has (an) opening(s) above the device isolation region having a width smaller than the predetermined value and an active region adjacent to this device isolation region.

In the case where the semiconductor substrate is used in the form of a wafer, the resist pattern may preferably have an opening in the peripheral region of the wafer.

Further, the opening formed in the active region adjacent to the device isolation region whose width is greater than or equal to the predetermined value may be somewhat larger or smaller than the active region, but may preferably be substantially as large as the active region. Here, the "predetermined value" means such a width that is likely to allow the dishing phenomenon to occur in the conventional flattening process. Such a value can be determined mainly from the depth of the trench and the thickness of the insulating film formed on the semiconductor substrate in the previous steps. For example, the value may be about twice as large as the thickness of the insulating film which has been determined according to the depth of the trench.

Subsequently, the insulating film is etched using the resist pattern as a mask by using conventional etching methods. Preferably the insulating film is etched to a degree such that the surface of the etched insulating film is lower than the surface of the insulating film existing in the device isolation region having a width greater than or equal to the predetermined value, more preferably to such a degree that the surface of the etching-stop layer is not completely exposed, that is, to a degree such that the insulating film remains on the etching-stop layer.

By etching the insulating film in this manner, a steep convex of the insulating film is formed around the active region adjacent to the device isolation region having a width greater than or equal to the predetermined value, while loss of the insulating film by etching can be avoided on the surface of the device isolation region having a width greater than or equal to the predetermined value because this surface is covered with the resist pattern.

Subsequently, the insulating film remaining on the resulting semiconductor substrate is polished for flattening after the resist pattern is removed. At this time, the insulating film is polished in such a manner that the surface of the etching-stop layer is completely exposed in the active region (on the etching-stop layer)by using CMP method, for example.

If the surface of the insulating film is etched in the previous step to a level lower than the surface of the insulating film existing in the device isolation region having a width greater than or equal to the predetermined value, degree of over-etching can be minimized since polishing in this step can be easily controlled according to the thickness of the insulating film. Accordingly, even if over-etching takes place above the etching-stop layer, the over-etching can be effectively and surely prevented by the etching-stop layer. In addition to that, since the insulating film is etched beforehand in the previous step, time necessary for this polishing step can be shortened, whereby variations in polishing amount over the surface, dependence on the pattern and the dishing phenomenon can be reduced.

The process for fabricating a semiconductor of the present invention is now discussed in further detail with reference to the attached drawings.

In an embodiment of the invention, explanation is given to a process for fabricating a semiconductor device including a region where the width for device isolation is large as well as a region where the width for device isolation is small such as a memory cell.

First, as shown in FIGS. 1(*a*) and 1(*a'*), a pad oxide film 302 (402) of 10 nm thickness is formed in a region 301 where the width for device isolation is large and a region 401 where the width for device isolation is small on a P-type semiconductor substrate. Then a nitride film of 80 nm thickness is formed as an etching-stop layer 303 (403) on the pad oxide film. Subsequently, a resist is applied onto the etching-stop layer and patterned into a desired configuration to form a resist pattern 311 (411). Using the resist pattern 311(411) as a mask, the etching-stop layer 303 (403) and the pad oxide film 302 (402) are sequentially removed by etching from a device isolation region-to-be, while the etching-stop layer (303) 403 and the pad oxide film 302 (402) are retained on an active region-to-be.

Figure 3A:
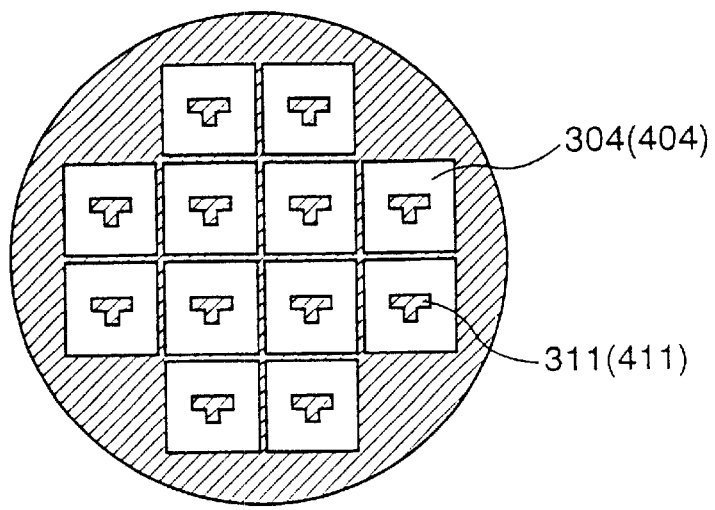
FIGS. 3(*a*) and 3(*b*) are top plan views of a wafer illustrating an embodiment of the process for fabricating a semiconductor device of the present invention.
Figure 3B:
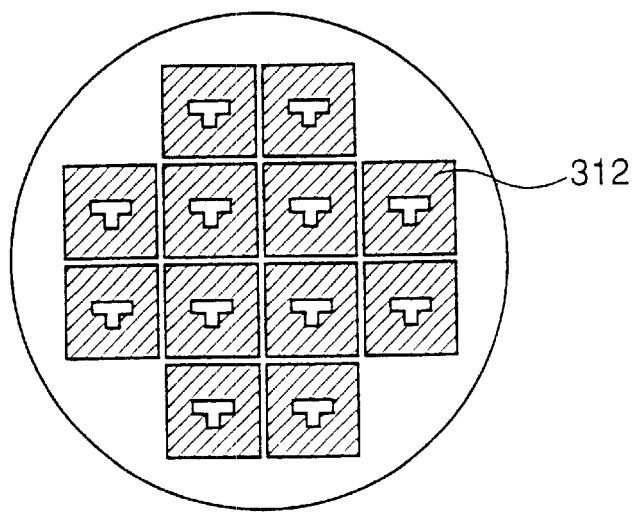

Next, as shorn in FIGS. 1(*b*) and 1(*b'*), using the resist pattern 311 (411) as a mask, the semiconductor substrate 301 (401) is etched to form a trench 304 (404) of about 300 nm depth. Thereby, a mesa portion is formed just under the etching-stop layer 303 (403) on the semiconductor substrate 301 (401). Referring to FIG. 3(*a*), on a wafer provided with a plurality of semiconductor substrates, the peripheral portion of the wafer is not etched because the peripheral portion is covered with a resist pattern 311 (411). Then the resist patterns 311 (411) are removed, and an oxide film 305 (405) of 10 nm thickness is formed in the trench 304 (404).

Then, as shown in FIGS. 1(*c*) and 1(*c'*), a buried insulating film 306 (406) of about 500 nm thickness is deposited on the semiconductor substrate 301 (401) including the etching-stop layer 303 (403) and the trench 304 (404). At this stage, a convex portion 306*a* (406*a*) is formed in the buried insulating film 306*a* (406*a*) on and around the etching-stop layer 303 (403) on the semiconductor substrate 301 (401). The surface of the convex portion is higher than the surface of the buried insulating film 306 (406) in other regions.

Then, as shown in FIGS. 1(*d*) and 1(*d'*), a resist is applied onto the resulting substrate 301 (401) and patterned into a desired configuration to form a resist pattern 312. The configuration of the resist pattern 312 has an opening above the etching-stop layer 303 on the region 301 where the width for device isolation is large (i.e., an active region adjacent to a device isolation region having a width greater than or equal to the predetermined value) as well as an opening on a region 401 where the width for device isolation is small. Referring to FIG. 3(*b*), the resist pattern has an opening in the peripheral region of the wafer and the peripheral region of the wafer is not covered with the resist pattern. Here, the large width for device isolation is about double the thickness of the buried insulating film 306 (406) or more. Where the width for device isolation is greater than the double of the thickness of the buried film 306 (406), the surface of the buried insulating film 306 on the trench 304 is lower than the surface of the buried insulating film 306 on the etching-stop layer 303 (see FIG. 1(*c*)). In such a case, the resist pattern 312 needs to cover the trench 304, which will be the device isolation region, to prevent the buried insulating film 306 on the trench 304 from being etched.

Subsequently, using the resist pattern 312 as a mask, the buried insulating film 306 (406) is etched by using conventional method. This etching is so performed to remove a central portion of the convex 306*a* of the buried insulating film 306 on the etching-stop layer 303, which will be the active region, and leave an oxide film 308 of about 50 nm thickness on the etching-stop layer 303. Thereby a steep convex 307 is formed in the buried insulating film 306 existing around the etching-stop layer 303. In the region (401) where the resist pattern 312 is not present, the entire surface of the buried insulating film 406 is etched, and an oxide film 408 is left on the etching-stop layer 403, having almost the same thickness as the oxide film 308.

Figure 4A:
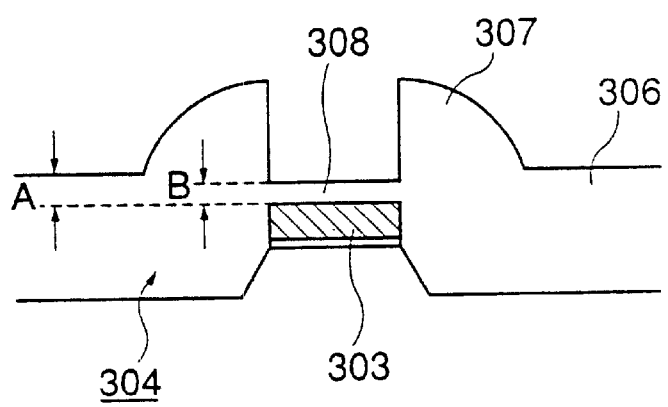
FIGS. 4(*a*) and 4(*b*) are schematic sectional views of a major part illustrating an embodiment of the process for fabricating a semiconductor device of the present invention.
Figure 4B:
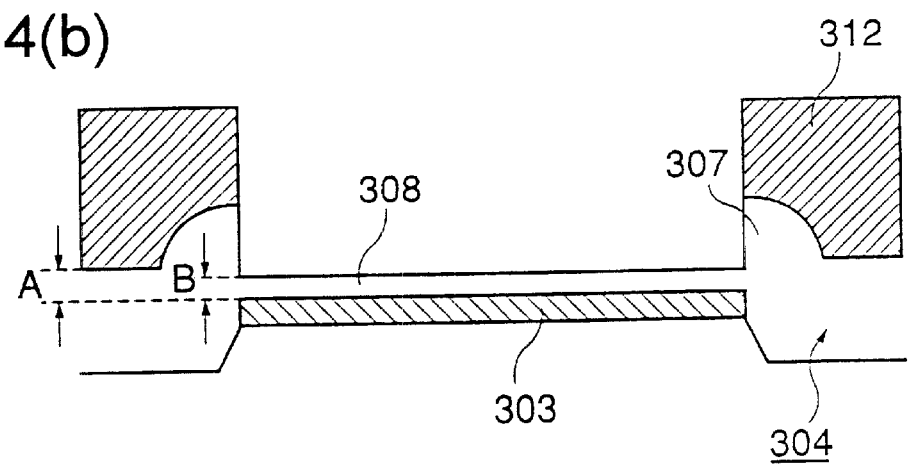
Figure 5A:
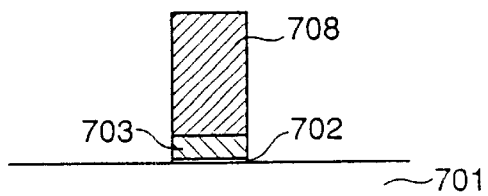
FIGS. 5(*a*) to 5(*d*) are schematic sectional views of a major part illustrating a conventional process for fabricating a semiconductor device.
Figure 5B:
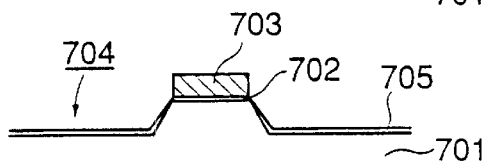
Figure 5C:
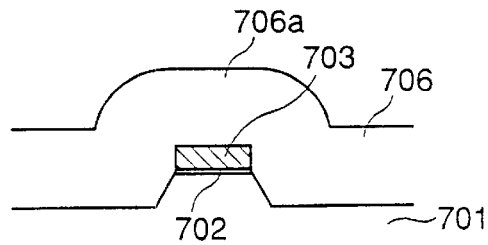
Figure 5D:
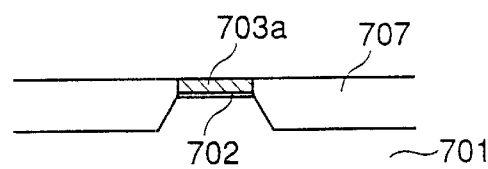
Figure 6:
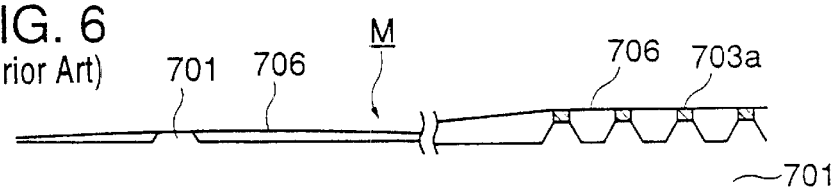
FIG. 6 is a schematic sectional view of a major part illustrating a problem of the conventional process for fabricating a semiconductor device shown in FIGS. 5(*a*) to 5(*d*)
Figure 7:
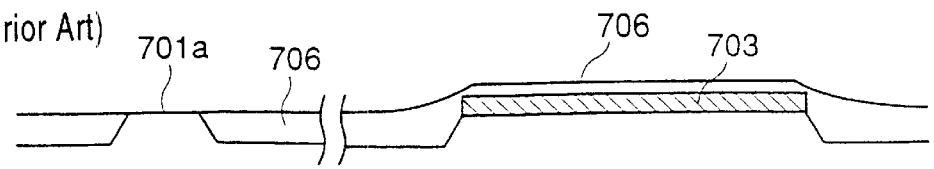
FIG. 7 is a schematic sectional view of a major part illustrating another problem of the conventional process for fabricating a semiconductor device shown in FIGS. 5(*a*) to 5(*d*)
Figure 8A:
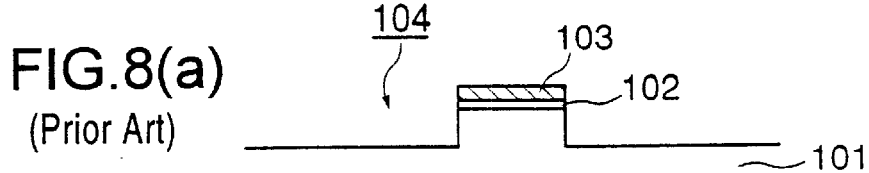
FIGS. 8(*a*) to 8(*f*) are schematic sectional views of a major part illustrating another conventional process for fabricating a semiconductor device.
Figure 8B:
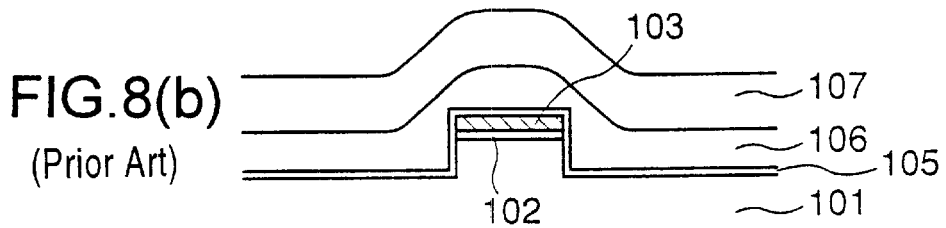
Figure 8C:
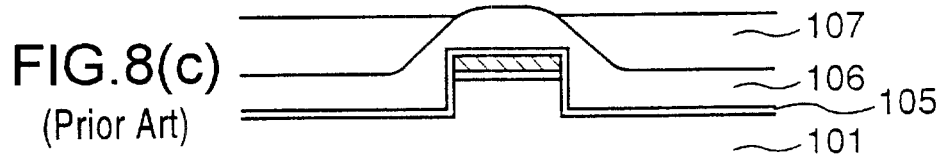
Figure 8D:
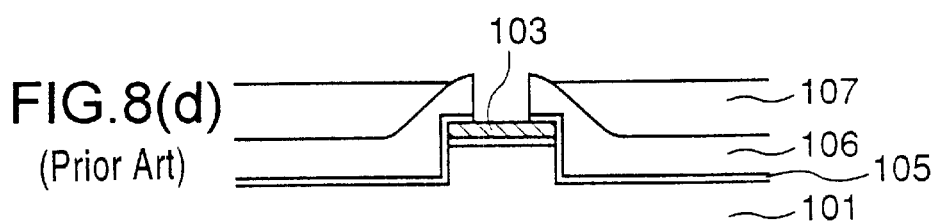
Figure 8E:
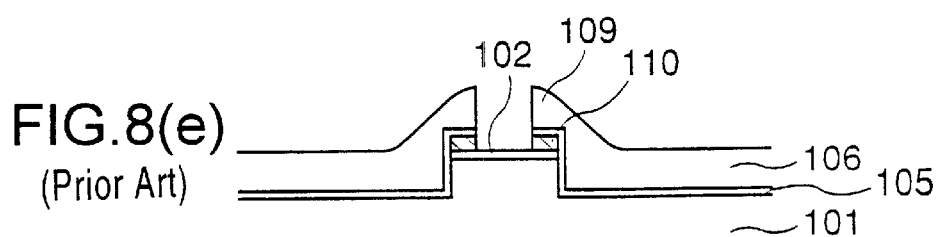
Figure 8F:
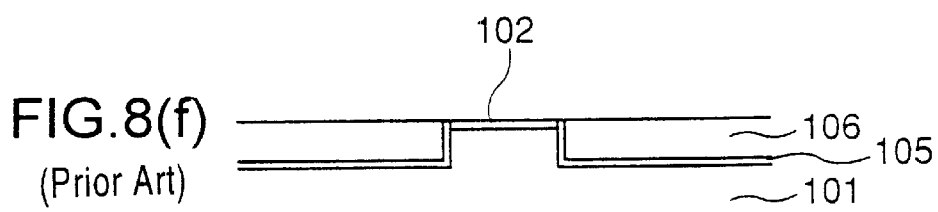
Figure 9A:
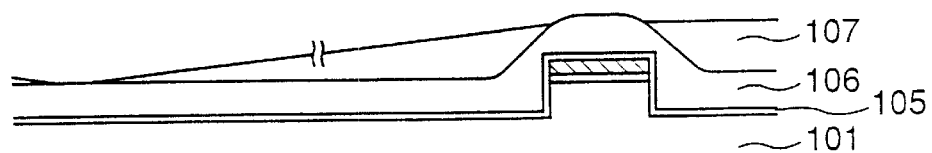
FIGS. 9(*a*) and 9(*b*) are schematic sectional views of a major part illustrating a problem of the conventional process for fabricating a semiconductor device shown in FIGS. 8(*a*) to 8(*f*).
Figure 9B:
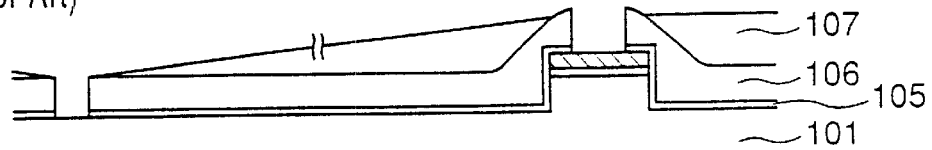

As regards the region 301 where the width for device isolation of the semiconductor substrate is large, the etching is so performed to leave an oxide film 308 of about 50 nm thickness on the etching-stop layer 303, as shown in FIG. 4(*b*), even if the active region has a large width (i.e., a width that is likely to allow the dishing phenomenon to occur in the conventional flattering process though such width differs depending on the pattern of active regions and device isolation regions around the active region). Thereby a steep convex 307 is formed in the buried insulating film around the etching-stop layer 303.

When the central portion of the convex 306*a* of the buried insulating film 306 is etched, the top surface of the oxide film 308 remaining on the etching-stop layer 303 is preferably lower than the top surface of the buried insulating film 306 in the trench 304. In this embodiment, the top surface of the buried insulating film 306 in the trench 304 is 500 nm high from the surface of the semiconductor substrate 301, while the top surface of the oxide film 308 remaining on the etching-stop layer 303 is 440 nm high.

In other expression, this relation can be represented by the following formula:

$$A > B,$$

wherein A is the thickness of the buried insulating film 306 in the trench 304 from the top surface of the etching-stop layer 303 and B is the thickness of the oxide film 308 remaining on the etching-stop layer 303, as shown in FIGS. 4(*a*) and 4(*b*).

If such conditions are satisfied, even taking variations in the thickness of the insulating film when produced into consideration, independently of the area (width) of the active region, the thickness of the buried insulating film required to be polished in the next step (the optimum polishing amount) is A where the active region has a small area as shown in FIG. 4(*a*), because the device isolation region occupies a greater proportion and the small active region is regarded as the device isolation region so that the polishing proceeds for the device isolation region. Where the active region has a large area as shown in FIG. 4(*b*), the optimum polishing amount is required greater than the B, which is the remained oxide film 308 on the etching-stop layer 303 and therefore about A, because the device isolation region occupies a smaller proportion and this area is regarded as the same as an area where only the active region exists. For the above reasons, even the area where the active region has a larger area is exposed to a polishing of deepness A. However, since the etching-stop layer 303 has a large area, the area can stand over-etching of A minus B.

Then, as shown in FIGS. 2(*e*) and 2(*e*'), the buried insulating film 306 (406) and the oxide film 308 (408) are polished by the CMP method until the etching-stop layer 303 (403) is exposed. Thereby, it is possible to make substantially even an exposed surface 306*b* (406*b*) of the buried insulating film 306 (406) and an exposed surface 303*a* (403*a*) of the etching-stop layer 303 (403).

Then, as shown in FIGS. 2(*f*) and 2(*f*'), the etching-stop layer 303 (403) and the pad oxide film 302 (402) are removed, and a gate oxide film 309 (409) of 10 nm thickness is formed on the active region by thermal oxidation.

Subsequently, as shown in FIGS. 2(*g*) and 2(*g*'), a polysilicon film 310 (410) is deposited to a thickness of 200 nm, which is a material for a gate electrode and is doped with phosphorous as impurities. Then a resist pattern 313 (413) is formed.

Then, as shown in FIGS. 2(*h*) and 2(*h*'), the polysilicon film 310 (410) is patterned to obtain the gate electrode 310*a* (410*a*) using the resist pattern 313 (413) as a mask.

According to the process for fabricating a semiconductor device the present invention, even in the case where device isolation regions different in width and active regions different in width exist together in a pattern for a semiconductor device, the device isolation regions can be formed of buried insulating films whose surfaces are flattened with good reproducibility regardless of the widths of the device isolation regions and the active regions.

Especially if the insulating film is etched beforehand so that the surface of the partially etched insulating film is lower than the surface of the insulating film in a device isolation region wider than or equal to a predetermined value, polishing time necessary for exposing the surface of the etching-stop layer can be easily controlled according to the thickness of the buried insulating film even in the area including a wide device isolation region. Therefore, it has become possible to obtain a semiconductor device of high accuracy in which the flatness is improved.

Even where the device isolation region and/or the active region are/is wide, it is also possible to control the time of polishing the buried insulating film for flattening as described-above. Therefore, a buried insulating film can be formed which is flattened with better accuracy.

Moreover, since the insulating film is partially etched in advance, the polishing time for flattening can be reduced. Therefore, the etching-stop layer against over-etching can be formed thinner, which will lead to reduction in production costs.

Further, since polishing can be well controlled and can be done in a shorter time, the dishing phenomenon which has been a problem with the conventional process can be prevented. Therefore, it is possible to avoid an increase in the capacity between the substrate and the interconnections. It has also become easier to pattern a connection layer and a gate electrode, which will lead to production of semiconductor device of high reliability.

Usually, when the CMP method is used, the polishing rate is faster in the periphery of the wafer and therefore the thickness of the device isolation regions after being polished are poor in uniformity in the wafer. According to the method of the invention, on the other hand, the resist pattern is left in the periphery of the wafer for the purpose of preventing the periphery from being polished when the trench is formed for the device isolation region. Thus stopper efficiency (selective ratio) in the periphery of the wafer can be improved. Further, when the buried insulating film is flattened, the periphery of the wafer can be polished after the buried insulating film is partially etched on the etching-stop layer. The evenness of the whole surface of the wafer can be improved.

What is claimed is:

1. A process for fabricating a semiconductor device comprising:

forming an etching-stop layer on a semiconductor substrate;

patterning the etching-stop layer so that the etching-stop layer remains in a region to be an active region and is removed from a region to be a device isolation region, followed by forming a trench in the region to be the device isolation region;

depositing on the semiconductor substrate an insulating film having a thickness greater than the depth of the trench;

forming a resist pattern covering a substantial portion of a device isolation region whose width is at least as great as a predetermined value, said resist pattern having a first opening above the active region adjacent to the device isolation region whose width is at least as great as a predetermined value and a second opening above both a) another device isolation region whose width is smaller than the predetermined value and b) another active region on which the etching-stop layer also remains adjacent to said another device isolation region, followed by etching the insulating film via the first and second openings in the resist pattern using the resist pattern as a mask so that both (i) a top surface of the insulating film remaining on a portion of the etching stop layer and (ii) a top surface of the insulating film remaining in or on said another device isolation region are each at an elevation(s) less than an elevation of the lowest top surface of the insulating film in the device region whose width is at least as great as the predetermined value; and polishing the insulating film existing on the resulting semiconductor substrate for flattening after removing the resist pattern.

2. The process according to claim 1, wherein the insulating film has a thickness greater than the sum of the depth of the trench and the thickness of the etching-stop layer.

3. The process according to claim 1, wherein the predetermined value is double the thickness of the insulating film or more.

4. The process according to claim 1, wherein the insulating film comprises a silicon oxide film.

5. The process according to claim 1, wherein the etching-stop layer comprises a silicon nitride film.

6. The process according to claim 1, wherein the polishing is performed by a CMP method.

7. The process of claim 1, wherein respective heights or elevations of each of (i) the top surface of the insulating film remaining on a portion of the etching stop layer and (ii) the top surface of the insulating film remaining in or on said another device isolation region are approximately the same.

8. A process for fabricating a semiconductor device comprising:

forming an etching-stop layer on a wafer providing a plurality of semiconductor substrates;

patterning the etching-stop layer using a resist as a mask so that the etching-stop layer remains in a region to be an active region and in a peripheral region of the wafer and is removed from a region to be a device isolation region, followed by forming a trench in the region to be the device isolation region;

depositing on the wafer an insulating film having a thickness greater than or equal to the depth of the trench;

forming a resist pattern covering a substantial portion of a device isolation region whose width is at least as great as a predetermined value, said resist pattern having a first opening above the etching-stop layer in the active region adjacent to a device isolation region whose width is greater than a predetermined value and a second opening above both a) another device isolation region whose width is smaller than the predetermined value and b) another active region adjacent to said another device isolation region on which the etching stop layer also remains, followed by etching the insulating film using the resist pattern as a mask so that both (i) a top surface of the insulating film remaining on a portion of the etching stop layer and (ii) a top surface of the insulating film remaining in or on said another device isolation region are each at an elevation(s) less than an elevation of the lowest top surface of the insulating film in the device region whose width is at least as great as the predetermined value; and polishing the insulating film existing on the resulting wafer for flattening after removing the resist pattern.

9. The process of claim 8, wherein respective heights or elevations of each of (i) the top surface of the insulating film remaining on a portion of the etching stop layer and (ii) the top surface of the insulating film remaining in or on said another device isolation region are approximately the same.

10. A process for fabricating a semiconductor device, the method comprising:

forming an etching-stop layer on a semiconductor substrate;

patterning the etching-stop layer so that the etching-stop layer is removed from a region to be a device isolation region;

forming a trench in the region to be a device isolation region;

depositing on the semiconductor substrate an insulating film having a thickness greater than a depth of the trench;

forming a resist pattern covering a substantial portion of a device isolation region whose width is at least as great as a predetermined value, said resist pattern having a first opening adjacent to the device isolation region whose width is at least as great as a predetermined value and a second opening above both a) another device isolation region whose width is smaller than the predetermined value and b) another active region adjacent to said another device isolation region, followed by etching the insulating film via the first and second openings in the resist pattern so that both (i) a top surface of the insulating film remaining on a portion of the etching stop layer and (ii) a top surface of the insulating film remaining in or on said another device isolation region are each at an elevation(s) less than an elevation of the lowest top surface of the insulating film in the device region whose width is at least as great as the predetermined value;

removing the resist pattern; and polishing the insulating film after removing the resist pattern.

11. A process for fabricating a semiconductor device comprising:

forming an etching-stop layer on a semiconductor substrate;

patterning the etching-stop layer so that the etching-stop layer remains in a region to be an active region and is removed from a region to be a device isolation region, followed by forming a trench in the semiconductor substrate in the region to be the device isolation region;

depositing on the semiconductor substrate and over the patterned etching stop layer an insulating film having a thickness greater than the depth of the trench;

forming a resist pattern having an opening above the active region adjacent to a device isolation region whose width is at least as great as a predetermined value that is at least double the thickness of the insulating film, followed by etching the insulating film using the resist pattern as a mask so that both (i) a top surface of the insulating film remaining on a portion of the etching stop layer and (ii) a top surface of the insulating film remaining in another smaller device isolation region are each at an elevation(s) less than an elevation of the lowest top surface of the insulating film in the device region whose width is at least as great as the predetermined value; and polishing the insulating film existing on the resulting semiconductor substrate for flattening after removing the resist pattern.

12. The process of claim 11, wherein respective heights or elevations of each of (i) the top surface of the insulating film remaining on a portion of the etching stop layer and (ii) the top surface of the insulating film remaining in or on said another device isolation region are approximately the same.

* * * * *